(12) United States Patent
Gieskes et al.

(10) Patent No.: US 7,836,582 B2
(45) Date of Patent: Nov. 23, 2010

(54) PRINTED CIRCUIT BOARD ASSEMBLY MACHINE

(75) Inventors: Koenraad Alexander Gieskes, Deposit, NY (US); John Edward Danek, Vestal, NY (US)

(73) Assignee: Universal Instruments Corporation, Binghamton, NY (US)

( * ) Notice: Subject to any disclaimer, the term of this patent is extended or adjusted under 35 U.S.C. 154(b) by 787 days.

(21) Appl. No.: 11/609,423

(22) Filed: Dec. 12, 2006

(65) Prior Publication Data

US 2008/0134498 A1    Jun. 12, 2008

(51) Int. Cl.
*B23P 19/00*    (2006.01)

(52) U.S. Cl. .............................. 29/739; 29/740; 29/743; 198/346.1; 198/346.2

(58) Field of Classification Search ............ 198/346.1, 198/346.2, 465.1–465.3; 29/740, 739, 743, 29/832; 414/222, 222.01
See application file for complete search history.

(56) References Cited

U.S. PATENT DOCUMENTS

| | | | | |
|---|---|---|---|---|
| 5,778,524 A * | 7/1998 | Stridsberg | ................... | 29/836 |
| 6,526,651 B1 * | 3/2003 | Hwang | ..................... | 29/740 |
| 6,892,446 B2 * | 5/2005 | Hwang et al. | ................ | 29/740 |
| 7,032,304 B2 * | 4/2006 | Gieskes | ..................... | 29/832 |
| 7,036,213 B2 * | 5/2006 | Kabeshita et al. | ............ | 29/740 |
| 7,200,922 B2 * | 4/2007 | Kabeshita et al. | ............ | 29/740 |
| 7,219,787 B2 * | 5/2007 | Kabeshita et al. | ........ | 198/346.2 |

* cited by examiner

*Primary Examiner*—Douglas A Hess
(74) *Attorney, Agent, or Firm*—Schmeiser, Olsen & Watts, LLP

(57) ABSTRACT

Provided is a PCB assembly machine including a board handling system configured to transport a PCB through the PCB assembly machine, wherein the PCB assembly machine further includes a pick and place system configured to pick and place electrical components onto the PCB. The PCB assembly machine also includes a feeder system configured to supply the electrical components, wherein the board handling system mounts directly to the feeder system.

17 Claims, 8 Drawing Sheets

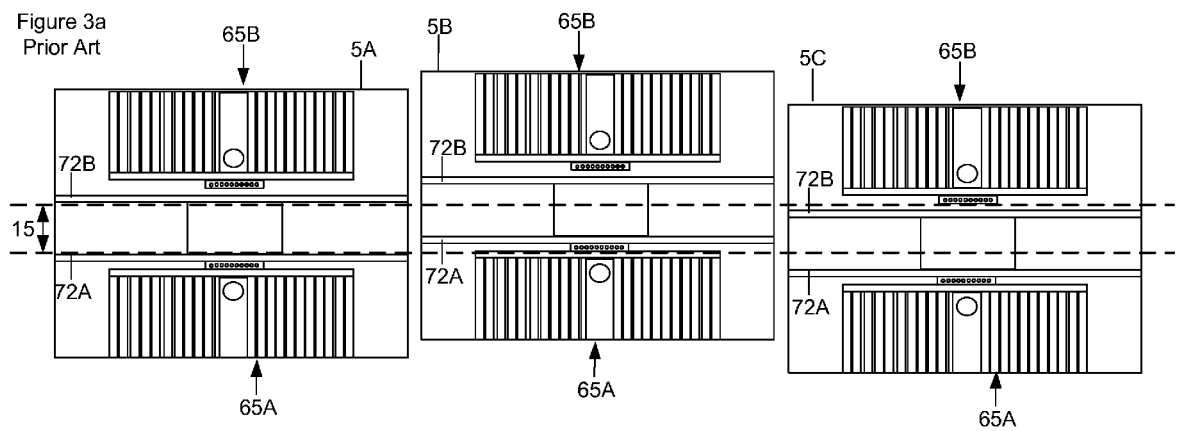
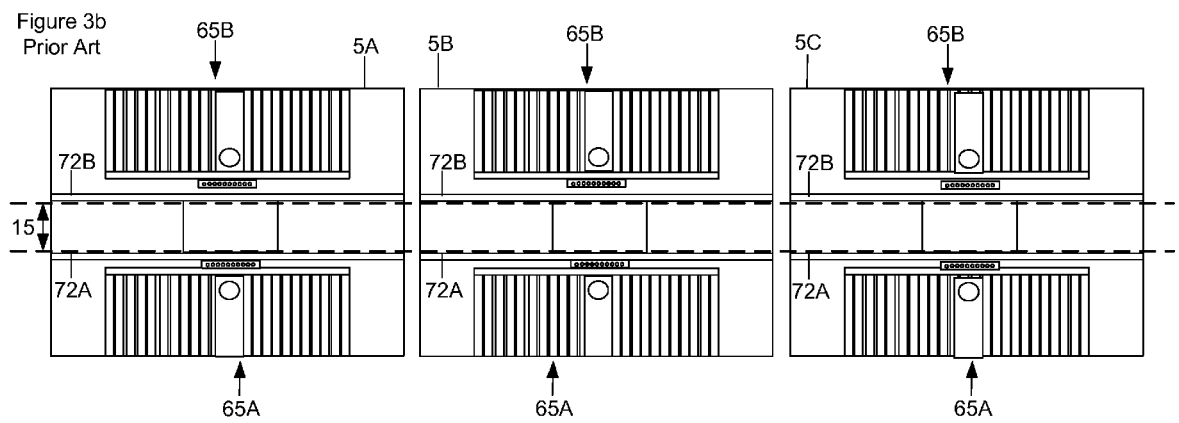

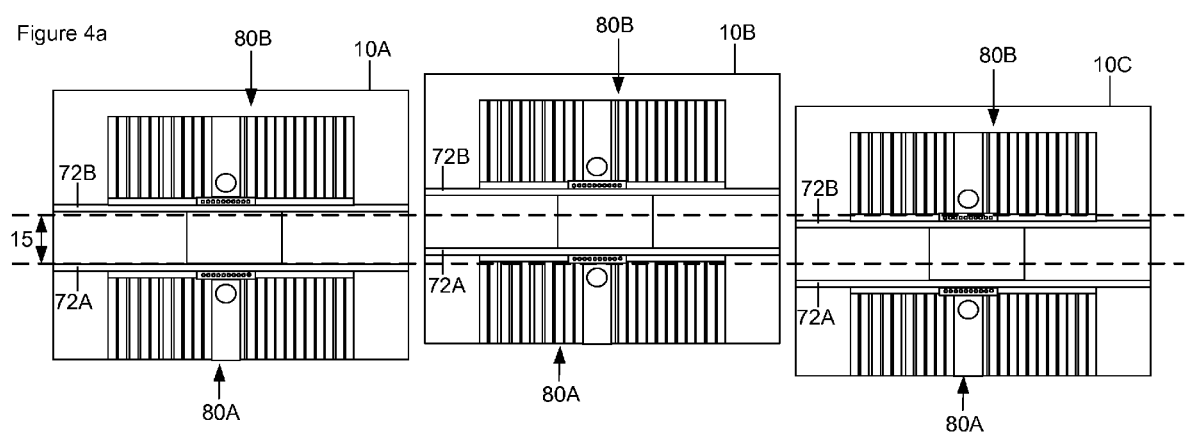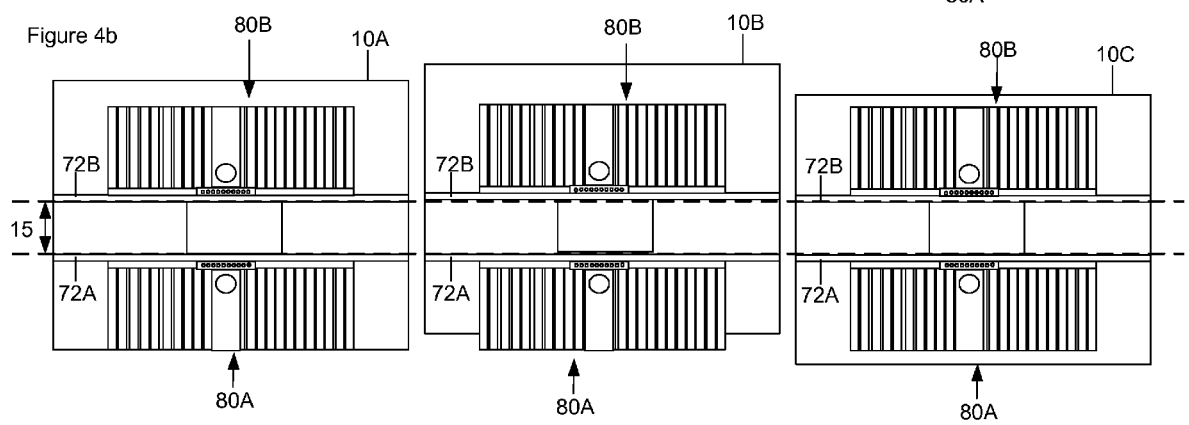

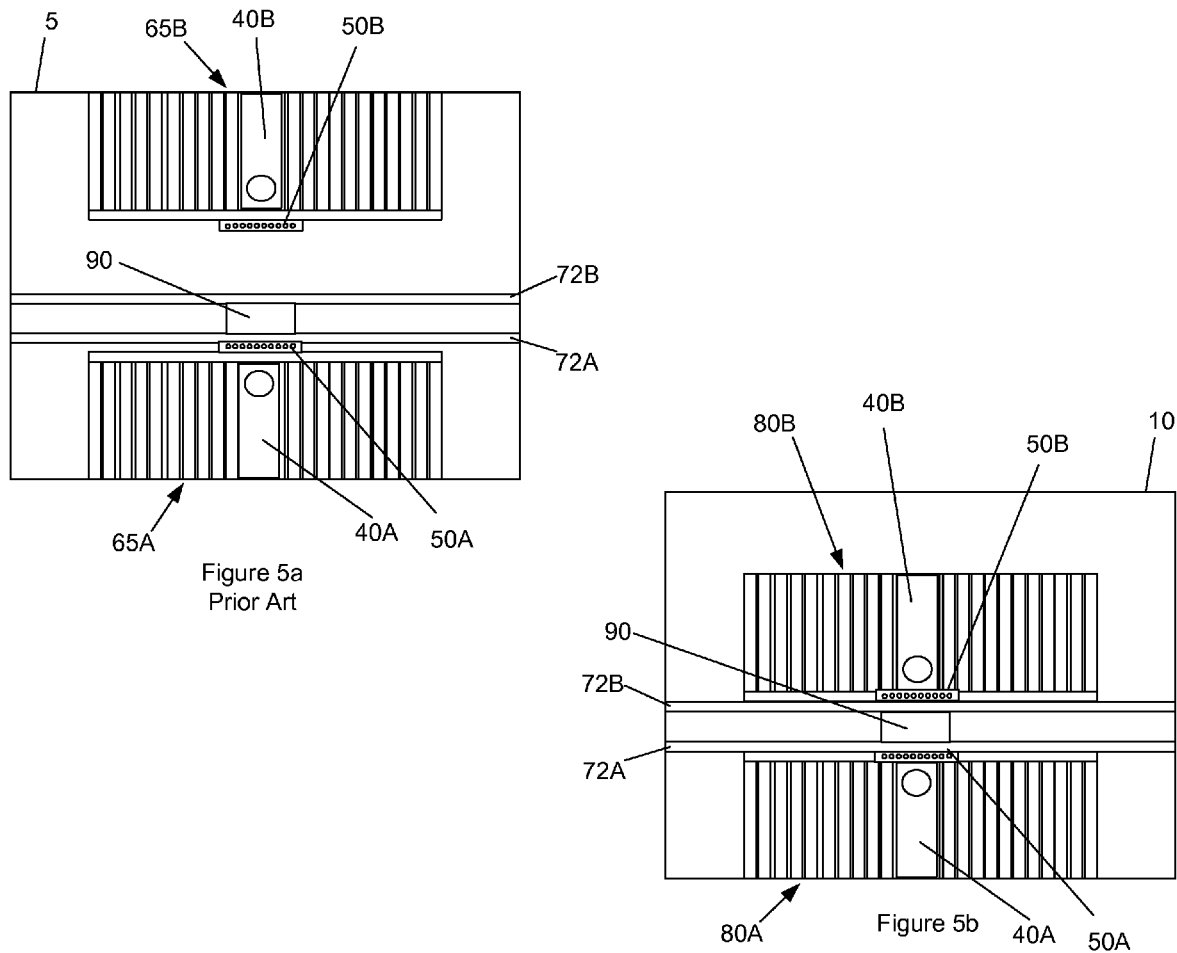

PRINTED CIRCUIT BOARD ASSEMBLY MACHINE

BACKGROUND OF THE INVENTION

1. Technical Field

The present invention relates to assembly machines, more specifically assembly machines for assembling electronic components on to printed circuit boards (PCBs).

2. Related Art

The assembly of electronic components on to printed circuit boards (PCBs) using a PCB assembly machine (hereinafter "machine") is well known in the art. However, as more and more requests are made for machines that are easily moveable and quickly reconfigurable between lines of machines, the ease of reliably transferring the PCB through the machine becomes problematic. Another area of constant desired improvement is to increase the throughput of the machine while at the same time maintaining, if not reducing, the cost of the machine regardless of the size of the PCB.

Common PCB assembly machines typically comprise a variety of subsystems to facilitate the assembly process. These may include, but are not limited to: a PCB handling system—for transferring at least one PCB into, through, and out of the machine; a feeder system—for supplying electronic components to the machine; a pick and place system—for transferring components from the feeder system to the PCB(s); a vision system—for inspecting, inter alia, the PCB(s) and the components; and a nozzle changer system—for supplying one or more nozzles to the pick and place system.

A typical PCB handling system may comprise separate mechanisms, including, inter alia, multiple rails that carry transport belts to transfer a PCB in and out of the machine. In general, these rails may also include a clamping mechanism to hold the PCB in position while a pick and place system places components on the PCB. Moreover, a typical PCB handling system may include, a first rail located in a fixed position when the PCB handling system is operably connected with a PCB assembly machine. In addition, a second rail of a typical PCB handling system may be movable/adjustable, with respect to the PCB assembly machine, to adapt the handling system to the width of a PCB. The adjust mechanism may be motorized or manual, such as a hand wheel. The rails may be mounted on the machine frame. Alternatively, the rails may be mounted on a separate PCB handling structure assembled outside the machine, which structure may then be operably connected to the PCB assembly machine.

A common feeder system often comprises feeder banks upon which one or more feeders may be mounted in order to supply the electronic components. Additionally, the feeder banks may be located in a fixed position within the PCB assembly machine and may provide support for other subsystems that may be necessary for the assembly of PCBs. Such subsystems may comprise one or more vision systems, and/or one or more nozzle changer systems. Vision systems may be used to acquire images of the components prior to their placement onto a PCB. Nozzle changer systems typically manage additional nozzles either for the replacement of a damaged or contaminated nozzle or for the exchange of one nozzle for another nozzle to accommodate various component holding needs.

In ordinary PCB assembly machines, the distance between the PCB and the component feeder banks is often bigger when the PCB is narrow in width (as shown in FIG. 5A). Moreover, most PCBs are narrow compared to the machines maximum PCB width capability. Accordingly, a typical pick and place system must travel extra distance to pick and place components, which takes extra time; thus, the extra travel distance creates inefficiencies that contribute to lower throughput. Similar inefficiencies hold true for any extra distance various systems of the machine may have to travel in order to obtain images of the components or to exchange nozzles.

Another significant disadvantage of common PCB assembly machines is that it is hard to set the machine up in such a way that the board handlings systems are properly oriented to facilitate transfer of PCBs from one assembly machine to another. For example, fixed rails must be aligned to preceding and/or following machines or conveyors accurately enough to transfer the PCB reliably in and out. To accomplish this, a machine operator typically moves each heavy machine into alignment with the machine or conveyor adjacent to it. This aligning of the entire machine is tedious and cumbersome amounting to extra time and expense.

Accordingly, there exists a need for an improved printed circuit board assembly machine.

SUMMARY OF THE INVENTION

The present invention provides an improved system for transferring printed circuit boards (PCBs) and assembling electronic component thereon using a PCB assembly machine.

A first general aspect of the invention provides a printed circuit board assembly machine comprising: at least one pick and place system configured to pick and place at least one component onto at least one printed circuit board; at least one feeder system configured to supply said component; and at least one board handling system configured to transport said printed circuit board through said machine; wherein said board handling system mounts directly to said feeder system.

A second general aspect of the invention provides a PCB assembly machine combined system for supplying at least one component and for transporting at least one printed circuit board comprising: a feeder system configured to supply said component; and a board handling system configured to transport said printed circuit board; wherein said board handling system is mounted to said feeder system.

A third general aspect of the invention provides a printed circuit board assembly machine comprising: at least one pick and place system configured to pick and place at least one component onto at least one printed circuit board; and at least one combined system configured to supply said component and to facilitate transporting of said circuit board through said machine.

A fourth general aspect of the invention provides a PCB assembly machine combined system for supplying at least one component and for transporting at least one printed circuit board comprising: a feeder system configured to supply said component; and a board handling system configured to transport said printed circuit board; wherein said board handling system and said feeder system move congruently.

A fifth general aspect of the invention provides a printed circuit board assembly machine comprising: at least one pick and place system configured to pick and place at least one component onto at least one printed circuit board; at least one feeder mounted on at least one feeder bank configured to supply said component; and a board handling system configured to transport said circuit board through said assembly machine; wherein a distance the pick and place system must travel between said feeder and said printed circuit board remains essentially constant regardless of the size of the printed circuit board The foregoing and other features of the invention will be apparent from the following more particular description of various embodiments of the invention.

BRIEF DESCRIPTION OF THE DRAWINGS

FIG. 3a depicts a top sectional view of a plurality of prior art PCB assembly machines before alignment;

FIG. 3b depicts a top sectional view of a plurality of prior art PCB assembly machines after alignment;

FIG. 4a depicts a top sectional view of an embodiment of a plurality of PCB assembly machine embodiments before alignment, in accordance with the present invention;

FIG. 4b depicts a top sectional view of an embodiment of a plurality of PCB assembly machine embodiments after alignment, in accordance with the present invention;

FIG. 5a depicts a top sectional view of a prior art PCB assembly machine;

FIG. 5b depicts a top sectional view of an embodiment of a PCB assembly machine, in accordance with the present invention;

DETAILED DESCRIPTION OF THE INVENTION

Figure 1:
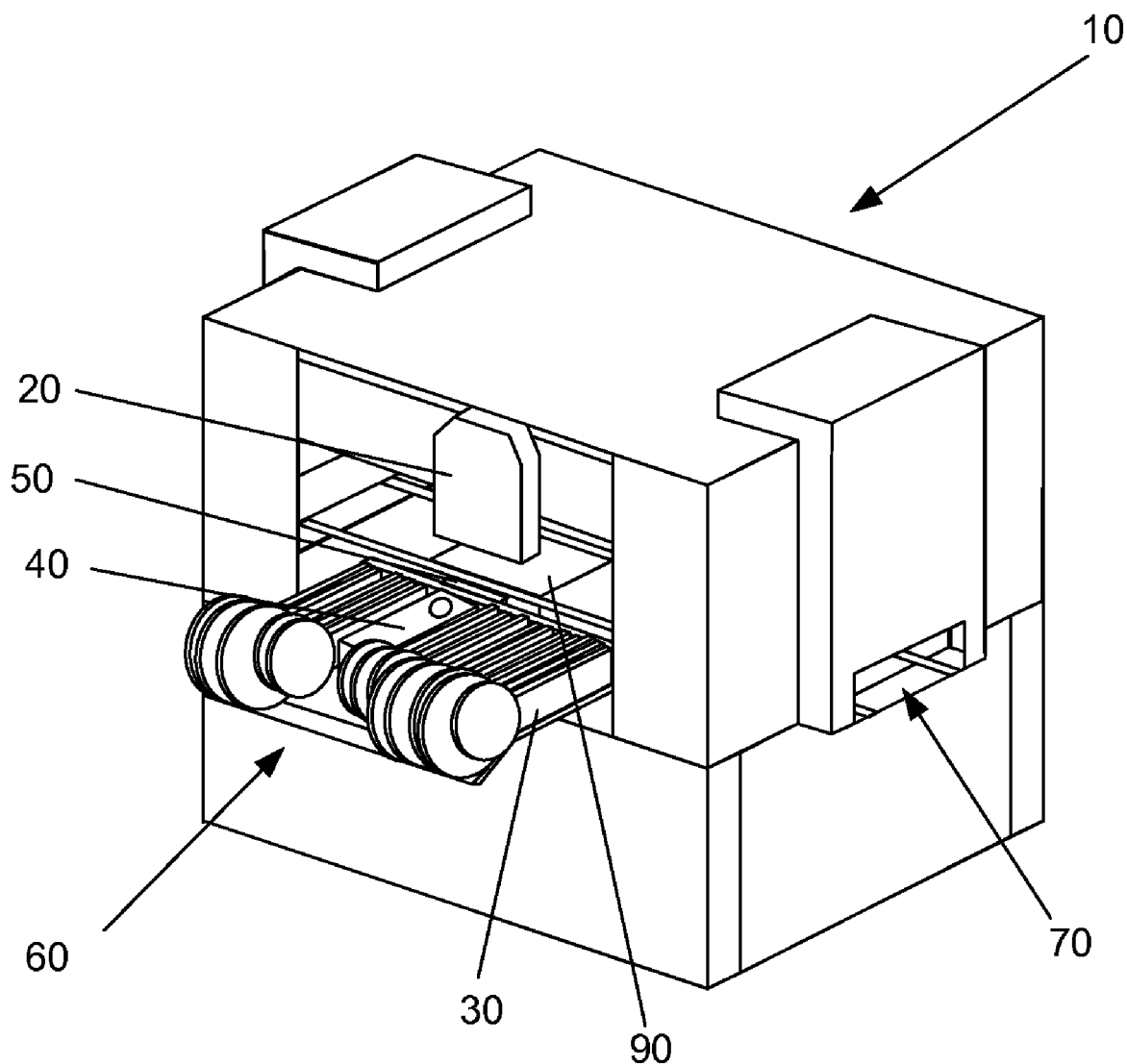
FIG. 1 depicts a front perspective view of an embodiment of a PCB assembly machine, in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

Embodiments of the present invention may eliminate cumbersome and inefficient PCB assembly system components and methods. For example, common individual rails and a typical width adjust mechanism of a typical PBC assembly machine may be made more efficient by integrating board handling components, such as the rails, inclusive of the PCB clamping mechanism and transport belts, into an existing feeder interface/support system (hereinafter "feeder system") thereby creating a combined feeder/board handling systems (hereinafter "combined system") which may be made moveable by hand or machine. As such, the distance between a feeder system, as well as vision and nozzle changer systems potentially supported by the feeder system, and the PCB may be optimally maintained. A combined system may be configured to ride on linear bearings to make adjustment by hand easier. Moreover, a combined system may also be configured to enable enough angular freedom of movement, such that by simply moving the combined system, and not an entire heavy assembly machine, alignment may be achieved with contiguous components of other machines, such as preceding and/or following PCB assembly machines and/or conveyors. In addition, once adjustment of a combined system into an operable position corresponding to the width of a pertinent PCB is complete, a simple clamping mechanism or other fastening device may be employed to hold the combined system in position while a pick and place system places PCB components. Those in the art should appreciate that a PCB assembly machine may include a plurality of combined systems, corresponding to a plurality of feeder banks and board handling components.

Eliminating board handling components, such as the individual rails and the adjustment mechanism in embodiments of PCB handling systems may provide a significant cost reduction. For instance, maintaining a constant and optimal distance between the component feeders and the PCB may allow the machine to operate significantly faster. Moreover, the fact that there is no fixed rail or other comparable fixed alignment component may make embodiments of the machine much easier to move from line to line. Freedom of movement in line positioning may be an important aspect for improving the flexibility of assembly machines systems and methods often required in the current electronics manufacturing environment.

In an alternate design, the machine may alter the distance between combined systems via a width adjustment mechanism. For example, the machine may include an automated device which adjusts width, distance between combined systems, via measured or predetermined PCB widths. While this design, including a width adjustment mechanism, may potentially increase the cost of the overall machine, the benefits of elimination of individual rails and the corresponding shorter distance between component feeders having combined alignment systems is still significant and may be desirable.

Figure 6:
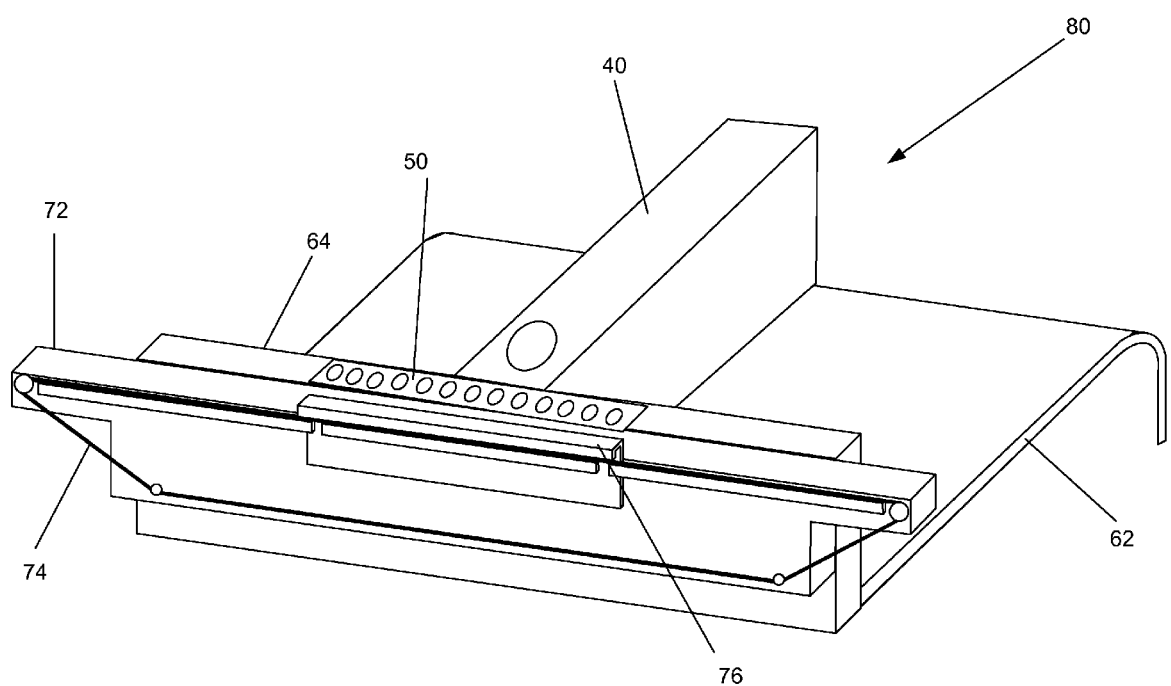
FIG. 6 depicts a perspective view of an embodiment of a combined system, in accordance with the present invention.

Turning now to the drawings, FIG. 1 depicts an embodiment of a PCB assembly machine 10, in accordance with the present invention. The machine 10 may comprise at least one feeder system 60. The feeder system 60 may include one or a plurality of feeders 30, that may contain, or be loaded with, electronic components that may ultimately be positioned on a printed circuit board such as the embodiment of a PCB 90. In addition feeder system 60 may include one or more feeder banks 62 and one or more feeder uprights 64 (as seen in FIG. 6). The electronic components, feeders 30, feeder banks 62, feeder uprights 64, various other component elements and overall arrangement of the feeder system 60 may vary according to desired operability. For example, the components may vary in size and shape. Additionally, the number, size and shape of the feeders 30, may vary according to component size and board placement potential.

Furthermore, the embodiments of a PCB assembly machine 10 may include at least one pick and place system 20. The pick and place system 20 may comprise a nozzle for holding a component and be configured to quickly pick, or select components from a feeder 30 of the feeder system 60. Moreover, the pick and place system 20 may be configured to seize a picked component and move to place the component in a precise location on a PCB, such as PCB 90. In addition, the pick and place system 20 may be configured to pick and place a plurality of components on PCB 90 during a single pick and place sequence or multiple pick and place sequences. For example, the pick and place system may include a spindle device or other mechanism having a plurality of nozzles each operable to pick and place electronic components.

In order to aid the picking and placing of components, embodiments of a PCB assembly machine 10 may include one or more vision systems. A vision system may comprise a camera 40, which may image an electronic component prior to its placement on to PCB 90. From the obtained image, a vision system processor (not shown) may determine whether or not the electronic component is placeable or not and the relationship of the component to the pick and place system 20. Additionally, a vision system may determine may help facilitate accurate placement of an electronic component on to a PCB.

Still further, embodiments of a PCB assembly machine 10 may be configured with one or more nozzle changer systems 50. A nozzle changer system 50 may store and manage additional nozzles that may be provided either for the replacement of a damaged or contaminated nozzle or for the exchange of one nozzle for another nozzle to accommodate various component holding needs.

Even further still, the embodiments of a PCB assembly machine 10 may also include at least one PCB handling system 70 configured to transport the PCB 90 through the machine 10. Embodiments of the PCB handling system 70 may also include a transport belt 74 (as seen in FIG. 6) upon which the PCB 90 may ride while being transported through said machine 10. Moreover, embodiments of the PCB handling system 70 may also be configured to operate with the feeder system 60. A PCB 90 may transfer into, or enter the machine 10 via PCB handling system(s) 70, to a position within the machine 10, such as the approximate center of the machine 10, where a separate mechanism (such as clamp 76 as seen in FIG. 6, or other fastening device) may secure the PCB 90 and hold it in position. Thus the clamp 76, or other comparable device may serve as means for clamping the PCB 90 in the machine 10. Pick and place system 20 may then pick at least one electronic component from at least one feeder 30 mounted on feeder system 60 and place the component onto a PCB 90. Once the pick and place process is complete the clamp 76, or other fastening device, may release PCB 90, which then may transfer out of assembly machine 10 via PCB handling system 70.

Figure 2:
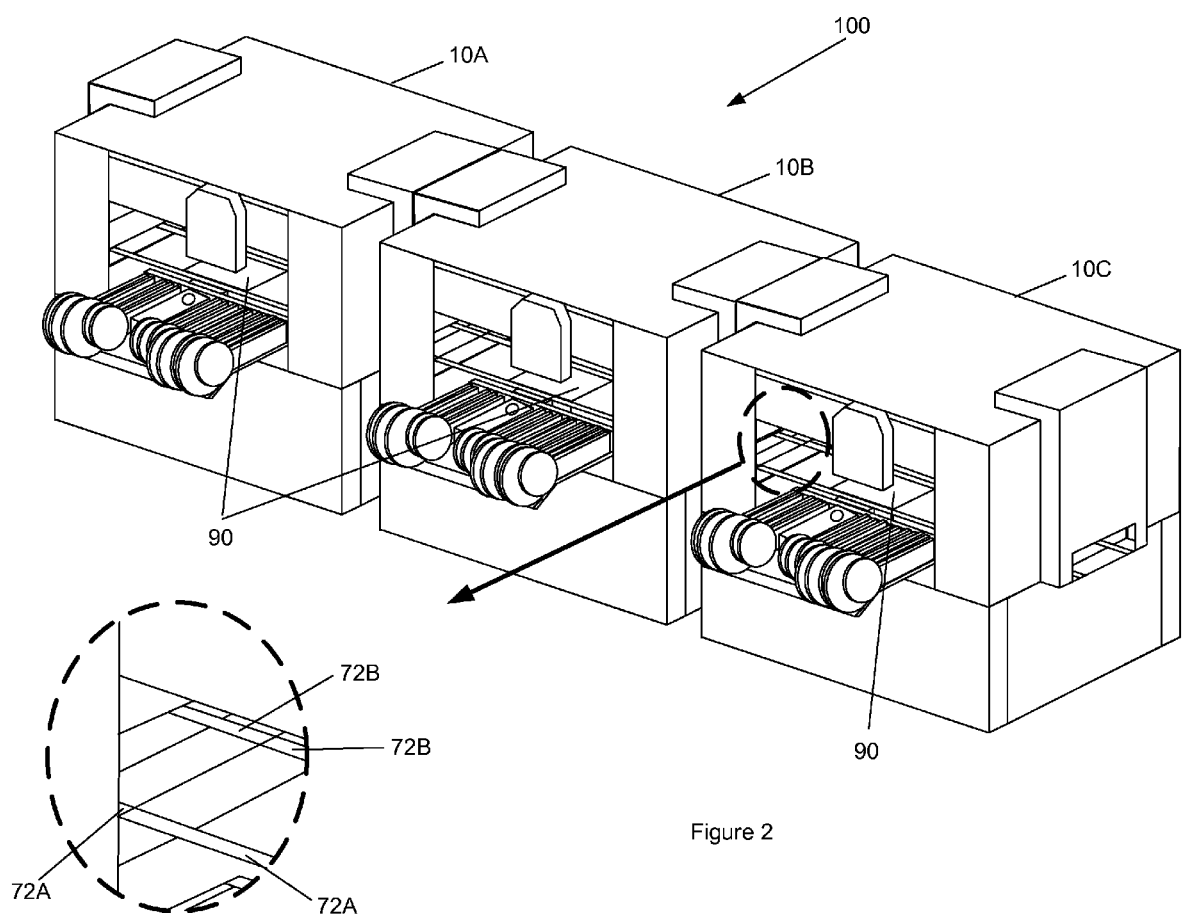
FIG. 2 depicts a front perspective view of an embodiment of a plurality of PCB assembly machines positioned contiguous to one another, in accordance with the present invention.

With continued reference to the drawings, FIG. 2 depicts an embodiment of a plurality of PCB assembly machines 10A-C positioned contiguous to one another. Accordingly, two or more machines 10 may be functionally integrated and physically brought together. As embodied a line of machines 100, may be positioned such that PCB 90 may pass through each machine 10. In such a configuration the machines 10A-C may be contiguous. For example, machine 10A and machine 10B may abut to each other and/or machine 10B and machine 10C may also abut each other. Alternatively, positioned between each of the machines 10A, 10B, and 10C may be a conveyor (not shown) that may be incorporated to aid in transferring PCB 90. Each machine 10 A, B or C may be similarly configured or may have some structural variance. Regardless of machine 10 configuration or whether a conveyor is utilized, a first rail 72A, or other comparable alignment component of machine 10A should be aligned to a first rail 72A, or other comparable alignment component of machine 10B, and a first rail 72A, or other comparable alignment component of machine 10B should be aligned to a first rail 72A of machine 10C. Moreover, second rails 72B of machines 10A, 10B, and 10C should also be aligned in order for PCB 90 to be transferred reliably from machine to machine.

With further reference to the drawings FIGS. 3a and 3b depict top sectional views of a plurality of typical prior art PCB assembly machines 5A-C before alignment (FIG. 3a) and after alignment (FIG. 3b). The PCB assembly machines 5A-C typically include feeder systems 65A-C, respectively. Also depicted are board transport rails 72A-B of machines 5A-C as located in before and after alignment positions in relation to a desired rail alignment 15. Accordingly, in the common prior art scenario and configuration, first rails 72A of machines 5A-C are provided in a fixed position within the machines 5A-C, while second rails 72B are moveable within machines 5A-C. The fixed positioning of first rails 72A within machines 5A-C can become problematic in that in alignment of the rails to the desired rail alignment 15, may often require physical movement of an entire machine and/or machines 5A-C. For example, as illustratively depicted, in order to align first rail 72A of machine 5A to first rail 72A of machine 5B, an operator, of necessity must move either the entire machine 5A, or the entire machine 5B, or move of both machines 5A and 5B. Once first rail 72A of machine 10A and first rail 72A of machine 10B are aligned to desired rail alignment 15, movement of machine 5C commences to align first rail 72A of machine 5C to first rail 72A of machine 5B and thereby to desired rail alignment 15. The order of movement of the machines is not important as long as once a rail of one machine aligns to a rail of another machine neither machine is moved. This configuration assumes routine or automatic alignment of second rails 72B.

Referring further still to the drawings, FIGS. 4a and 4b depict top sectional views of an embodiment of a plurality of PCB assembly machine embodiments 10A-C before alignment (FIG. 4a) and after alignment (FIG. 4b), in accordance with the present invention. Also depicted are embodiments of alignment components such as board transport rails 72A-B of machines 10A-C as located in before and after alignment positions in relation to a desired rail alignment 15. As embodied, first rails 72A, and second rails 72B are all moveable in machines 10A, 10B, and 10C. Structural configuration of first rails 72A and second rails 72B, which provide for movement of both rails 72A-B within machines 10A, 10B and 10C, may ease the alignment of the rails from machine to machine to the desired rail alignment 15. For example, greater freedom of movement of the alignment features such as rails 72A-B may negate the prior need to move an entire assembly machine (such as machine(s) 5 shown in FIGS. 3a-b) in order to align the rails of the machines as positioned in a line, such as line 100 (Shown in FIG. 2).

In accordance with embodiments of the present invention, a first rail 72A, or other comparable alignment component of machine 10A may be aligned to a first rail 72A, or other comparable alignment component of machine 10B through the movement of a combined system 80A of machine 10A, a combined system 80B of machine 10B, or through movement of both combined systems 80A and 80B. The combined system(s) 80 may be smaller lighter and more easily moveable than an entire assembly machine (such as machine(s) 5 shown in FIGS. 3a-b). Once first rail 72A of machine 10A and first rail 72A of machine 10B are aligned to desired rail alignment 15, movement of combined system 80, such as combined system 80A of machine 10C may commences to align first rail 72A, or other comparable alignment component of machine 10C to first rail 72A, or other comparable alignment component of machine 10B and thereby bring the rails into desired rail alignment 15. The process may be repeated to align second rails 72B, or other comparable alignment components of the machines 10A-C. Alternatively, second rails 72B may be aligned according the PCB width to be processed. In addition, it should be recognized that second rails 72B may be aligned prior to aligning first rails 72A. The order of movement of combined systems 80 is not important as long as once desired alignment 15 of at least one rail 72A or 72B of one machine 10 is achieved with respect to another machine 10, neither aligned combined system 80 of the machines(s) 10 is moved to bring the rails, or other comparable alignment components, out of alignment.

Turning now to FIGS. 5a and 5a, which, inter alia, illustrate differences between a common prior art machine 5 configuration and an embodied configuration of a PCB assembly machine 10, further aspects of the present invention are discussed. In FIG. 5a, which depicts a top sectional view of a prior art PCB assembly machine 5, the machine 5 comprises a first rail 72A which is fixed and a second rail 72B which moveable. Both, first feeder system 65A and second feeder system 65B, are fixed; that is neither feeder system 65 moves in conjunction with the movement of the second rail 72B. Therefore, when a narrow PCB 90 transfers into machine 10, the space increases between second feeder system 65B and PCB 90, as well as camera 40B and nozzle changer system 50B, while space between first feeder system 65A and PCB 90 remains the same. In contrast, as shown in FIG. 5b, which depicts a top sectional view of an embodiment of a PCB assembly machine 10, an embodiment of the present invention may include a machine 10 comprising a first combined system 80A and a second combined system 80B. The combined systems 80A-B may facilitate joint movement of alignment components such as the rails 72A-B and feeder(s) 30. Therefore when a narrow PCB 90 transfers into assembly machine 10, the space between first combined system 80A and PCB 90 may be optimized as may the space between second combined system 80B and PCB 90. By optimizing the spacing of the combined systems 80 relative to the PCB 90, the machine 10 throughput may remain nearly constant in part because the amount of distance the pick and place system 20 must travel from picking of parts from either the first combined system 80A or the second combined system 80B to PCB 90 may also remain nearly constant. This optimization also applies for any movement that the pick and place system 20 must make in order to provide proper alignment with camera 40b or nozzle changer system 50B.

FIG. 6 shows a perspective view of an embodiment of a combined system 80. In terms of simple construction, a rail 72, or other comparable alignment component, may removably attach directly to a feeder upright 64 as does feeder bank 62. Rail 72 may also comprise a transport belt 74 upon which the PCB 90 may ride. The combined system 80 may further include a clamp 76 or other fastener device, which may hold the PCB 90 in position during the placement of components.

Figure 7:
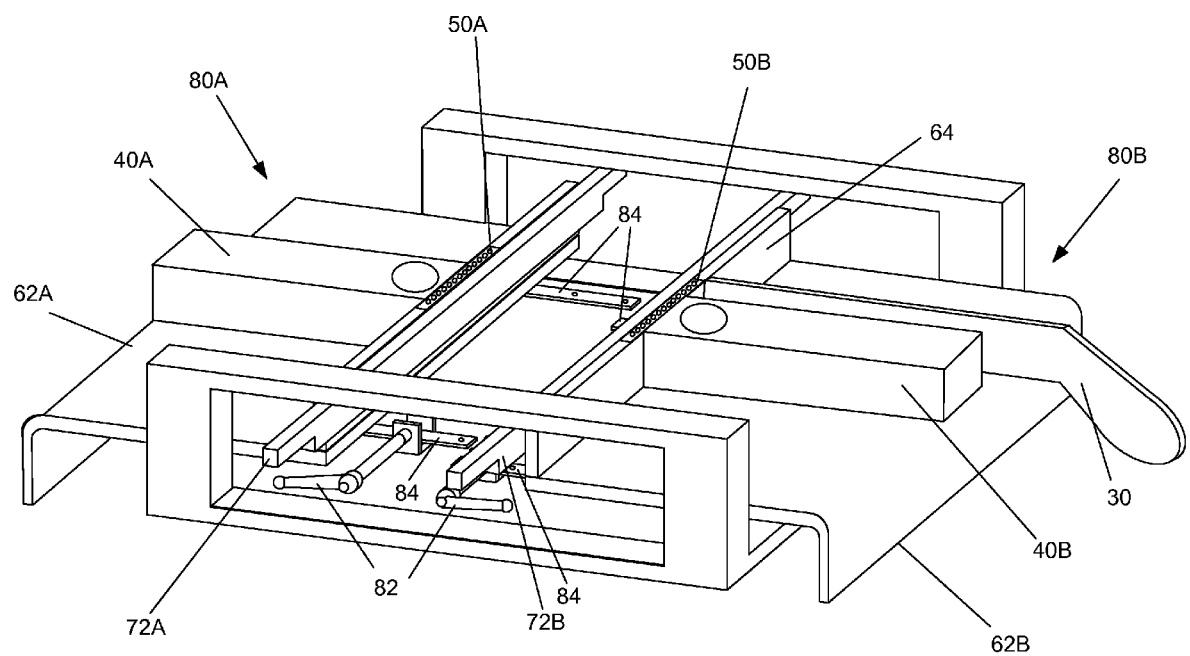
FIG. 7 depicts a perspective view of an embodiment of a combined handling system as it may be mounted to elements of an embodiment of a PCB assembly machine, in accordance with the present invention.

FIG. 7 depicts a perspective view of an embodiment of a combined system 80a as it may be mounted to elements of an embodiment of a PCB assembly machine 10 (not shown in entirety). The assembly machine 10 may include a board handling system 70 (shown in FIG. 1) that may be mounted to a feeder system 60 (also shown in FIG. 1) to form a combined system, such as combined system 80A or combined system 80B that may be mounted within the assembly machine 10. The combined system(s) 80A-B may ride on linear rails 84 in order to align to an adjacent machine and to adjust for various sizes of PCB 90. The linear rails may serve as means for adjusting said combined systems 80A-B to help facilitate proper alignment of an assembly machine 10 with an adjacent machine. However, those in the art should appreciate that other controlled movement component features such as grooves, slots, bars, rollers, bearings, pulleys, gears, screws and/or similar component features of combinations thereof, may be utilized to facilitate movement of the combined system(s) 80A-B. Locking mechanisms 82 may hold the combined system(s) 80A-B in position once the combined system(s) 80A-B have been moved to a desired location. Thus the locking mechanisms 82 or other comparable fastening devices may serve as means for locking the combined system(s) 80A-B in a position.

Figure 8:
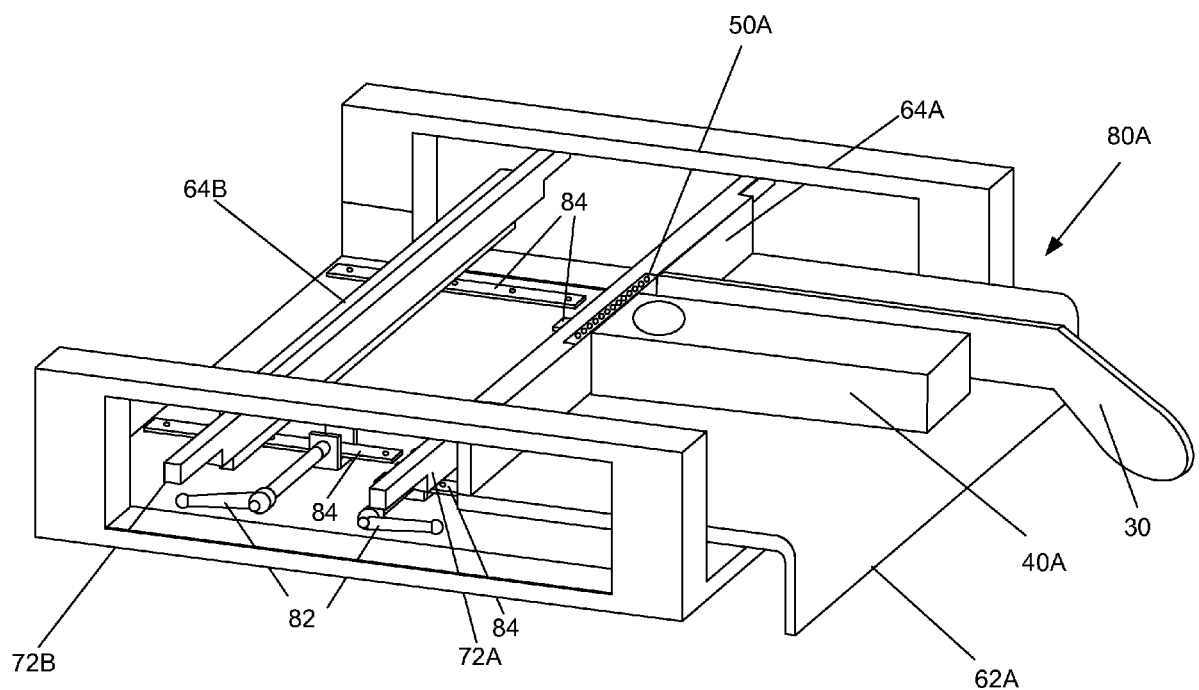
FIG. 8 depicts a perspective view of another embodiment of a combined system as it may be mounted to elements of an embodiment of a PCB assembly machine, in accordance with the present invention.

As depicted, the embodiment of the combined system(s) 80A-B require manual manipulation to move on linear rails 84 and activation/deactivation of locking mechanisms 82. However, those in the art should appreciate that, alternatively, the combined system(s) 80A-B, while operating with components such as linear rails 84 or other comparable controlled movement component features, could be automatically driven into position using any one of the known positioning systems available (i.e. lead screw, belt etc.). Moreover, movement of the combined systems may be automated. In this manner, the distance between first rail 72A and second rail 72B could be automatically altered as the size of PCB 90 changes without human intervention. Still yet, first rail 72A may only adjust manually for machine to machine to machine alignment while second rail 72B may adjust automatically as PCB 90 changes in size, or visa versa. Thus the linear rails 84 or other comparable alignment features may serve as means for adjusting the combined system(s) 80A-B to accommodate different sized PCB's. Therefore, as the size of PCB 90 changes the distance between first rail 72A and second rail 72B may be adjusted. Where the board handling system 70 (shown in FIG. 1) has been integrated with the feeder system 60 (also shown in FIG. 1) to form a combined system 80A or 80B, board handling system 70 and the feeder system 60 may move congruently. Additionally, the distance between first feeder bank 62A and second feeder bank 62B also may also be adjusted. Accordingly, the combined system(s) 80A-B may also, inter alia, facilitate desired alignment 15 (as shown in FIG. 5b) and serve to assist the transportation of a PCB, such as PCB 90, through a plurality of assembly machines 10, such as by a board handling system 70 (as shown in FIG. 1). FIG. 8 shows another embodiment of the combined system 80 wherein combined system 80A comprises rail 72A, feeder bank 62A, and upright 64A of feeder system 60A and combined system 80B comprises only rail 72B and upright 64B of feeder system 60B. Those in the art should appreciate that further configurations may be possible, such as by switching components of combined system 80A with components of combined system 80B, as depicted in FIG. 8, to form an oppositely arranged PBC assembly machine 10. Also shown in FIG. 8, is the merging of rail 72A and upright 64A into one common element for use with combined system 80A as opposed to the separate elements rail 72B and upright 64B depicted in combined system 80B. Additionally, a combined system 80 may or may not comprise nozzle changer system 50 or camera 40.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A printed circuit board assembly machine comprising:
at least one pick and place system configured to pick and place at least one component onto at least one printed circuit board;
at least one moveable feeder system configured to supply said component; and at least one moveable board handling system configured to transport said printed circuit board through said machine;
wherein said board handling system mounts directly to said feeder system such that said board handling system and said feeder system are congruently moveable.

2. The printed circuit board assembly machine of claim 1, wherein said feeder system of further comprises:
a feeder upright;
a feeder bank; and
at least one feeder loaded with said components.

3. The printed circuit board assembly machine of claim 1, wherein said board handling system further comprises:
a transport belt upon which said printed circuit board rides while being transported through said machine; and
means for clamping said printed circuit board in said machine while said pick and place system places said component onto said printed circuit board.

4. A PCB assembly machine combined system for supplying at least one component and for transporting at least one printed circuit board comprising:
a pick and place system configured to pick and place at least one component onto at least one printed circuit board;
a movable feeder system configured to supply said component; and
a movable board handling system configured to transport said printed circuit board;
wherein said board handling system is directly mounted to said feeder system such that said board handling system and said feeder system are congruently moveable.

5. The PCB assembly machine combined system for supplying at least one component and for transporting at least one printed circuit board of claim 4, wherein said feeder system further comprises:
a feeder upright;
a feeder bank; and
at least one feeder loaded with said components.

6. The PCB assembly machine combined system for supplying at least one component and for transporting at least one printed circuit board of claim 4, wherein said board handling system further comprises:
a transport belt upon which said printed circuit board rides while being transported through said machine; and
means for clamping said printed circuit board in said machine while said component is mounted onto said printed circuit board.

7. A printed circuit board assembly machine comprising:
at least one pick and place system configured to pick and place at least one component onto at least one printed circuit board; and
at least one combined system configured to supply said component and to facilitate transporting of said circuit board through said machine, the combined system including:
a movable feeder system being the element of the of the combined system configured to supply said component; and
a movable board handling system being the element of the of the combined system configured to transport said board;
wherein said board handling system is mounted to said feeder system such that said board handling system and said feeder system are congruently moveable.

8. The printed circuit board assembly machine of claim 7, wherein the combined system further comprises:
a feeder system configured to supply said components; and
a board handling system configured to transport said printed circuit board;
wherein said board handling system is mounted to said feeder system.

9. The printed circuit board assembly machine of claim 8, wherein said feeder system further comprises:
a feeder upright;
a feeder bank; and
at least one feeder loaded with said component.

10. The printed circuit board assembly machine of claim 8, wherein said board handling system further comprises:
a transport belt upon which said printed circuit board rides while being transported through said machine; and
means for clamping said printed circuit board in said machine while said pick and place system places said component onto said printed circuit board.

11. The printed circuit board assembly machine of claim 7, further comprising:
means for adjusting said combined system to align said machine to an adjacent machine.

12. The printed circuit board assembly machine of claim 7, further comprising:
means for adjusting said combined system to accommodate different sizes of said printed circuit board.

13. The printed circuit board assembly machine of claim 7, further comprising:
means for locking said combined system in a position.

14. A PCB assembly machine combined system for supplying at least one component and for transporting at least one printed circuit board comprising:
a pick and place system configured to pick and place at least one component onto at least one printed circuit board;
a moveable feeder system configured to supply said component; and
a moveable board handling system configured to transport said printed circuit board;
wherein said board handling system and said feeder system are jointly mounted such that said board handling system and said feeder system move congruently.

15. The PCB assembly machine combined system of claim 14, wherein said feeder system is further configured to support a camera.

16. The PCB assembly machine combined system of claim 14, wherein said feeder system is further configured to support one or more nozzle changer systems.

17. A printed circuit board assembly machine comprising:
at least one pick and place system configured to pick and place at least one component onto at least one printed circuit board;
at least one feeder mounted on at least one feeder bank configured to supply said component; and
a board handling system configured to transport said circuit board through said assembly machine;
wherein the feeder bank and the board handling system are combined and jointly moveable with respect to the printed circuit board assembly machine such that a distance the pick and place system must travel between said feeder and said printed circuit board remains essentially constant regardless of the size of the printed circuit board.

* * * * *

UNITED STATES PATENT AND TRADEMARK OFFICE
CERTIFICATE OF CORRECTION

| | |
|---|---|
| PATENT NO. | : 7,836,582 B2 |
| APPLICATION NO. | : 11/609423 |
| DATED | : November 23, 2010 |
| INVENTOR(S) | : Koenraad Alexander Gieskes and John Edward Danek |

It is certified that error appears in the above-identified patent and that said Letters Patent is hereby corrected as shown below:

Column 9, claim 2, line 2, "wherein said feeder system of further comprises" should read --wherein said feeder system further comprises--;

Column 9, claim 7, lines 9 and 13, "of the" is duplicated, remove duplicate words;

Signed and Sealed this
Twenty-second Day of March, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,836,582 B2 | Page 1 of 1 |
| APPLICATION NO. | : 11/609423 | |
| DATED | : November 23, 2010 | |
| INVENTOR(S) | : Koenraad Alexander Gieskes and John Edward Danek | |

It is certified that error appears in the above-identified patent and that said Letters Patent is hereby corrected as shown below:

Column 9, line 8 (claim 2, line 2) "wherein said feeder system of further comprises" should read --wherein said feeder system further comprises--;

Column 9, lines 57 and 61 (claim 7, lines 9 and 13) "of the" is duplicated, remove duplicate words;

The certificate supersedes the Certificate of Correction issued March 22, 2011.

Signed and Sealed this
Twenty-sixth Day of April, 2011

David J. Kappos
*Director of the United States Patent and Trademark Office*